(12) United States Patent
Chen

(10) Patent No.: US 6,429,530 B1
(45) Date of Patent: *Aug. 6, 2002

(54) MINIATURIZED CHIP SCALE BALL GRID ARRAY SEMICONDUCTOR PACKAGE

(75) Inventor: William Tze-You Chen, Endicott, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/184,839

(22) Filed: Nov. 2, 1998

(51) Int. Cl.$^7$ .......................... H01L 23/48; H01L 21/48
(52) U.S. Cl. .................. 257/778; 257/787; 438/113; 438/124; 438/126; 438/127; 438/458; 438/460
(58) Field of Search ................. 257/737, 738, 257/780, 781, 782, 783, 777, 787, 778, 784, 686; 438/108, 113, 114, 119, 458, 459, 124, 125, 460, 126, 127, 462, 464

(56) References Cited

U.S. PATENT DOCUMENTS

| | | | |
|---|---|---|---|
| 4,849,856 A | | 7/1989 | Funari et al. ............... 361/719 |
| 5,241,133 A | | 8/1993 | Mullen, III et al. ......... 257/693 |
| 5,363,277 A | | 11/1994 | Tanaka ....................... 361/760 |
| 5,473,514 A | | 12/1995 | Nagano ...................... 361/813 |
| 5,535,101 A | | 7/1996 | Miles et al. ................ 361/808 |
| 5,552,966 A | | 9/1996 | Nagano ...................... 361/813 |
| 5,646,830 A | | 7/1997 | Nagano ...................... 361/813 |
| 5,753,974 A | * | 5/1998 | Masukawa ................... 257/737 |
| 5,866,949 A | * | 2/1999 | Scheller ..................... 257/778 |
| 5,889,332 A | | 3/1999 | Lawson et al. .............. 257/778 |
| 5,918,113 A | * | 6/1999 | Higashi et al. .............. 438/119 |
| 5,930,599 A | * | 7/1999 | Fujimoto et al. ............ 438/113 |
| 5,950,070 A | * | 9/1999 | Razon et al. ................ 438/113 |
| 6,005,290 A | | 12/1999 | Akram et al. ............... 257/723 |
| 6,043,109 A | * | 3/2000 | Yang et al. .................. 438/113 |
| 6,064,114 A | * | 5/2000 | Higgins, III ................. 257/698 |
| 6,091,140 A | | 7/2000 | Toh et al. .................... 257/691 |
| 6,177,725 B1 | | 6/2001 | Yamada et al. ............. 257/704 |
| 6,245,598 B1 | * | 6/2001 | Chen et al. .................. 438/126 |
| 6,294,405 B1 | * | 8/2001 | Higgins, III ................. 438/108 |
| 6,291,884 B1 | * | 9/2001 | Glenn et al. ................. 257/747 |
| 6,340,606 B1 | * | 1/2002 | Hashimoto .................. 438/106 |

FOREIGN PATENT DOCUMENTS

| | | |
|---|---|---|
| EP | 0 771 029 A2 | 10/1996 |
| EP | WO 98/33211 | * 7/1998 |
| JP | 2001-044226 | 2/2001 |
| JP | 2001 132013 | * 11/2001 |

\* cited by examiner

*Primary Examiner*—David L. Talbott
*Assistant Examiner*—Alonzo Chambliss
(74) *Attorney, Agent, or Firm*—Scully, Scott, Murphy & Presser; John R. Pivnichny

(57) ABSTRACT

A semiconductor package arrangement and, more particularly, a light weight and miniaturized electronic package or module, wherein the dimensions between an integrated circuit comprising a semiconductor chip and those of a chip carrier have been optimized in order to provide for minimum weight and size relationships. Furthermore, disclosed is a method of forming the semiconductor package arrangement so as to produce a small, lightweight and essentially miniaturized chip-sized chip carrier package module. The chip carrier, which may be an organic laminate, multi-layer ceramic substrate or flexible substrate, as required by specific applications, is basically designed to possess overall smaller peripheral dimensions than those of the integrated circuit or semiconductor chip which is adapted to be mounted thereon. In essence, the chip carrier or substrate is electrically connected to the semiconductor chip through the intermediary of either solder bumps or a conductive adhesive, or other suitable flip chip connection methods. The utilization of an electronic package arrangement which comprises the mounting of a chip on a chip carrier or substrate, wherein the latter is of smaller peripheral dimensions than the semiconductor chip, and thereby eliminates in particular the edge stresses generated by the differentials in thermal expansion between the chip and chip carrier substrate, and in effect, reducing the previously generally encountered high mechanical stresses and extensive heat-induced warpage leading to potential failure of the electrical interconnects or solder joints.

16 Claims, 2 Drawing Sheets

MINIATURIZED CHIP SCALE BALL GRID ARRAY SEMICONDUCTOR PACKAGE

BACKGROUND OF THE INVENTION

The present invention relates to a semiconductor package arrangement and, more particularly pertains to a light weight and miniaturized electronic package or module, wherein the dimensions between an integrated circuit comprising a semiconductor chip and those of a chip carrier have been optimized in order to provide for minimum weight and size relationships. Furthermore, the invention is directed to a novel method of forming the semiconductor package arrangement so as to produce a small, lightweight and essentially miniaturized chipsized chip carrier package module.

In the electronic packaging technology, particularly with regard to semiconductor chip configurations incorporating integrated circuits, considerable differences are encountered in connection with the extent of thermal expansion due to the different coefficients of thermal expansion which are encountered between semiconductor chips and the chip carrier substrate which supports the chips. This results in the carrier substrate, such as employed in a epoxy glass laminate plastic ball grid array (BGA) being subjected to high levels of generated mechanical stresses and to extensive warpage, tending to adversely influence the electrical interconnects and possibly resulting in the failure of the electronic circuitry. Moreover, the problem is excascerbated with the constant increases in the sizes of semiconductor chips and their overall dimensions, as is predicated on current industry projections or roadmaps and also past trends in the technology. For instances, current flip-chip ball grid array (BGA) package designs are frequently subject to serious reliability risk including chip fracture risks in view of high tensile stresses which are encountered in the semiconductor chip. In particular, these high stresses are generated at the backside of the chip and also along the edge of the chip, where wafer dicing induced damage frequently form sites for the initiation of cracks or propagation of fissures. In order to alleviate the foregoing problems, the invention is adapted to considerably reduce the magnitude of stresses which are encountered in the semiconductor or electronic circuitry package, and is, in particular, adapted to ameliorate any stresses which are encountered at the edge of the package to very low and tenable levels, thereby eliminating chip fracture risks which are based on thermally-induced stresses acting on the chip edge wherein fracture initiation is especially susceptible due to the dicing of the wafer. Moreover, there is a lessening of any risk of BGA solder ball fatigue being encountered by the balls which are located toward the edge of the so-called chip shadow, inasmuch as pursuant to the inventive electronic package arrangement, solder balls are no longer arranged at the edge of the chip shadow, thereby eliminating the generating of any stresses at that location. Basically, the present inventive concept of the electronic or semiconductor or chip package renders it possible to provide for molded packages where, currently, chip size limitations do not allow for molding; for example, such as for specialized types of flip-chip plastic ball grid array packages. The chip assembly is presently handled individually, irrespective as to whether by solder reflow or wirebond, and wherein the present inventive electronic or semiconductor chip package arrangement and the method of producing the foregoing simplifies to a considerable extent the assembly procedure to the wafer level, and with a considerable potential for reducing manufacturing and assembly processing costs.

DISCUSSION OF THE PRIOR ART

In the presently practiced technology which concerns itself with the producing of chip-package modules consisting of semiconductor chips which are supported on substrates, such as chip carriers, the above-mentioned problems are particularly in evidence with regard to high tensile stresses particularly along the edge of the chip generated due to warpage and differentials in coefficients of thermal expansion present between the semiconductor chip and the chip carrier, ordinarily due to the chip being of a size which is smaller than the overall size or peripheral dimensions of the chip carrier.

Nagano, U.S. Pat. Nos. 5,646,830 and 5,473,514 each disclose semiconductor devices having interconnecting circuit boards, wherein islands constituting semiconductor chip carriers are essentially sized so as to provide peripheral dimensions which are larger than those of the integrated circuits or semiconductor chips which are positioned thereon. The interconnections of these components; in effect, the semiconductor chips and the chip carriers are subjected to stresses generated proximate the edges thereof, and which result in potential interconnect failures due to warpage created by the differences in the coefficients of thermal expansion evident between the semiconductor chip and chip carrier components.

Miles, et al., U.S. Pat. No. 5,535,101 discloses a leadless integrated circuit package module including a substrate or semiconductor chip carrier having an integrated circuit chip mounted thereto. In that instance, the substrate or carrier is of a larger overall dimension than the semiconductor chip which, due to the differences in their coefficients of thermal expansion, will in response to the generation of heat again cause high tensile stresses to be generated due to warpage between the components, thereby potentially resulting in failure of the electrical interconnects or joints, especially along the edge regions intermediate the components.

Mullen, III, et al., U.S. Pat. No. 5,241,133 discloses a leadless pad array chip carrier having a semiconductor chip mounted thereon, wherein the carrier or substrate is of larger overall dimensions than those of the semiconductor chip. This structure, as in the previously described patents, will also lead to the generating of high stresses, particularly along the edges of the semiconductor chip, due to heat-induced warpage encountered during operation.

Tanaka, U.S. Pat. No. 5,363,277 discloses a semiconductor chip which is supported on a chip carrier, the latter of which possesses overall larger peripheral dimensions than the chip, and wherein the differing thermal expansion properties between the chip and the chip carrier substrate are conducive to the generating of high mechanical stresses and resultingly considerable warpage, thereby potentially resulting in fatigue and electrical connect joint failures.

SUMMARY OF THE INVENTION

Accordingly, in order to obviate the foregoing problems which are prevalent in the current state-of-the-technology, the present invention contemplates the provision of a semiconductor package arrangement or module, and also discloses a method for the forming of the package arrangement in which the size of the semiconductor chip is essentially larger than that of the chip carrier substrate. The chip carrier, which may be an organic laminate, multi-layer ceramic substrate or flexible substrate, as required by specific applications, is basically designed to possess overall smaller peripheral dimensions than those of the integrated circuit or semiconductor chip which is adapted to be mounted thereon. In essence, the chip carrier or substrate is electrically connected to the semiconductor chip through the intermediary of either solder bumps or a conductive adhesive, or other suitable flip chip connection methods. The utilization of an electronic package arrangement which comprises the mounting of a chip on a chip carrier or substrate, wherein the latter is of smaller peripheral dimensions than the semiconductor chip, and thereby eliminates in particular the edge stresses generated by the differentials in thermal expansion between the chip and chip carrier substrate, and in effect, reducing the previously generally encountered high mechanical stresses and extensive heat-induced warpage leading to potential failure of the electrical interconnects or solder joints.

Accordingly, it is an object of the present invention to provide a novel and unique electronic or modular semiconductor package arrangement wherein a semiconductor chip which is attached to a chip carrier substrate possesses larger peripheral dimensions than the carrier substrate, thereby enabling the formation of chip package module sizes which are no larger than the integrated circuit dies or chip.

Another object of the present invention resides in the provision of a semiconductor package arrangement as described herein in which the semiconductor chip has at least one edge thereof extending outwardly beyond the edge of the chip carrier substrate. A more specific object of the present invention resides in the provision of a semiconductor package arrangement, in which a semiconductor chip is attached to a chip carrier substrate, and wherein the chip extends beyond the substrate on all sides of the semiconductor chip so as to facilitate the forming of the foregoing assembly on a wafer which is adapted to be sliced into individual chip sizes.

A further object of the present invention resides in the provision of a novel method of producing semiconductor package arrangements of the type described herein.

Still another object resides in the provision of a novel method of producing semiconductor package arrangement from a wafer having an array of discretely positioned chip carrier substrate elements mounted thereon and which is adapted to be sliced into individual semi-conductor chip package structures.

In essence, an inventive object also resides in the method of providing an insulative carrier or substrate which, on an upper side is equipped with solder balls or bumps; attaching a chip to an opposite side of the carrier substrate which at least one edge of the chip extending beyond a corresponding edge of the carrier substrate; producing electrical connections between the chip and chip carrier through the intermediary of either solder balls or bumps, or through conductive adhesives or wirebond extending between the chip and the upper side of the insulative chip carrier, with the wirebond extending over the corresponding edge of the chip carrier, or through any suitable combination of interconnection techniques; and wherein pursuant to a particular embodiment of the invention, the chip is larger in its peripheral dimensions than the chip carrier substrate about all sides thereof, whereby the carrier substrate can be attached to each chip while in wafer form, and enabling subsequent slicing of the wafer into individual semiconductor chip packages.

BRIEF DESCRIPTION OF THE DRAWINGS

Reference may now be had to the following detailed description of exemplary embodiments of the invention, taken in conjunction with the accompanying drawings; in which.

DETAILED DESCRIPTION OF PREFERRED EMBODIMENTS

Figure 1:
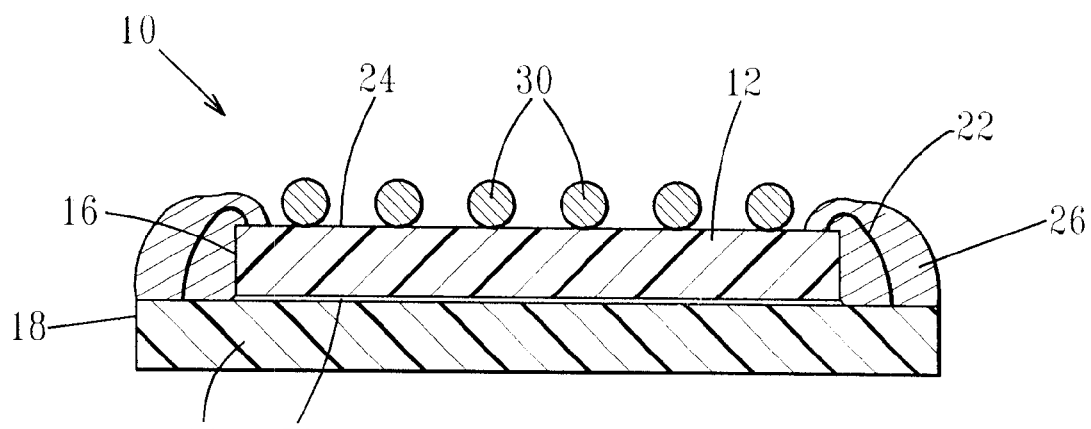
FIG. 1 illustrates a cross-sectional view through a first embodiment of the semiconductor package arrangement.

FIG. 1 illustrates a first embodiment of a semiconductor package arrangement 10 pursuant to the invention, in which a substrate or chip carrier 12 for the semiconductor chip 14 essentially consists of either an organic laminate, single or multi-layer ceramic substrate or a flexible substrate, possibly consisting of a suitable non-conductive material. The chip carrier substrate, in its overall or outer peripheral dimensions; for example, as illustrated being essentially rectangular in shape, is designed to be smaller than the semiconductor chip dimensions. At least one of the edge portions 16 of the chip carrier substrate 12 is recessed or set back from the associated edge portion 18 of the semiconductor chip 14, although preferably the entire periphery of the chip carrier substrate 12 is recessed or all edges set back within the peripheral confines of the semiconductor chip 14. As illustrated in FIG. 1 of the drawings, the chip carrier substrate 12 is electrically connected with the semiconductor chip 14 through a conductive adhesive 20 interposed therebetween, or it is also possible to contemplate the employment of other flip chip connection methods including solder balls, stud bumps, conductive paste, conductive film or any other mechanical or metallurgical interconnection. The interconnection, as indicated in that instance, may in addition be a wirebond 22 which extends within an insulative molding compound or within an encapsulating material projecting from the upper peripheral surface of the semiconductor chip 14 over the upper surface 24 of the chip carrier substrate 12. In the case where the flip chip interconnection employs solder bump or stud bump or other conductive bumps or metallurgical bumps, the underfill encapsulate material 26 which fills the space between the chip carrier substrate 12 and the semiconductor chip 14 is arranged below the substrate shadow. The underfill material forms essentially a fillet 26 around the substrate 12 over the chip 14. In the case where there are wirebond the encapsulant material will encapsulate the wires.

The surface of the chip carrier may also form a surface region on which solder balls 30, bumps or other conductors are adapted to produce an electrical connection with a subsequent layer; for instance, a printed circuit board (not shown) or the like. As illustrated in FIG. 1, this is in a form of ball grid array (BGA) solder balls 30. Although, solder balls 30 or bumps on the semiconductor chip 14 are illustrated herein, this further interconnection could be constituted wirebonds stud bumps, conductive adhesives, conductive compounds, electrically conductive films, or any other mechanical or metallurgical interconnections, as is well known in the technology.

Pursuant to a variant of the foregoing, which utilizes the wirebond, the electronic substrate chip carrier 12 may be positioned on the active side of the semiconductor chip 14 with a die bond adhesive, and wherein electrical connection is made from the edge of the chip not covered by the substrate shadow. Molding encapsulation or glop top materials are suitably applied so as to maintain the bonding wires in position, and the connection to the next level of the electronic package is provided for by the ball grid array 30.

Figure 2:
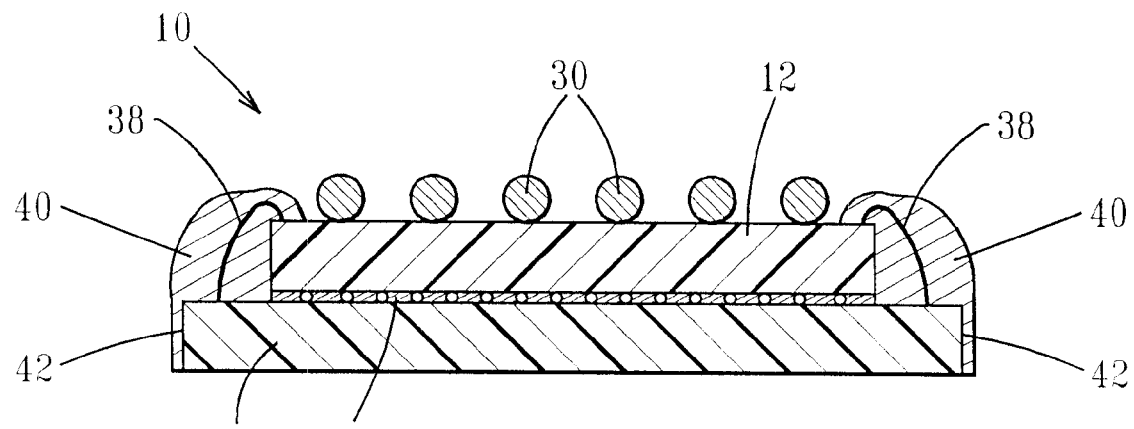
FIG. 2 illustrates a cross-sectional view through a second embodiment of the semiconductor package arrangement.

Reverting to the modified embodiment shown in FIG. 2 of drawings, in which similar or identical components are identified by the same reference numeral, in that instance the foregoing concepts are combined in that a portion of the electrical interconnection is implemented between the semiconductor chip 14 and the chip carrier substrate 14 through a conductive adhesive 36; for example, for signal interconnections; and for some of the other connection made with wirebond 38; for example, for power connections, leading to the other side of the carrier substrate and thereafter employing molding compound encapsulation or glop top 40, as shown in FIG. 2 encompassing the perimeter 42 of the semiconductor chip 14. In this connection, the flip chip package can be molded so that the molding compound comes either to the edge of the chip surface, as shown in FIG. 1, or extends about the edge side surfaces, as shown in FIG. 2 of the drawings.

In connection with the foregoing, it is not absolutely necessary that the both the length and width of the semiconductor chip 14 be larger than that of the chip carrier substrate 12. One lateral dimension of the carrier substrate 12 can be smaller or shorter than the corresponding dimension of the semiconductor chip 14, whereas the other lateral or edge dimensions can be either smaller, equal to or possibly even somewhat larger than the corresponding dimensions of the chip. The underfill encapsulant 26, 40 is adapted to fill the common projected space between the chip carrier substrate 12 and the semiconductor chip 14, whereas the underfill fillet will also extend over the two chip edges and the carrier surface, and over the two carrier edges and the chip surfaces, respectively.

Figure 3:
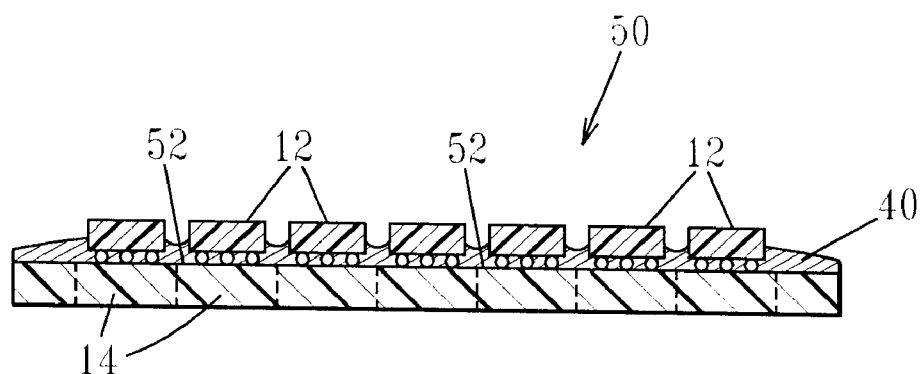
FIGS. 3 and 4 illustrate, respectively, cross-sectional and plan views of a wafer for producing a plurality of semiconductor chip arrangements.
Figure 4:
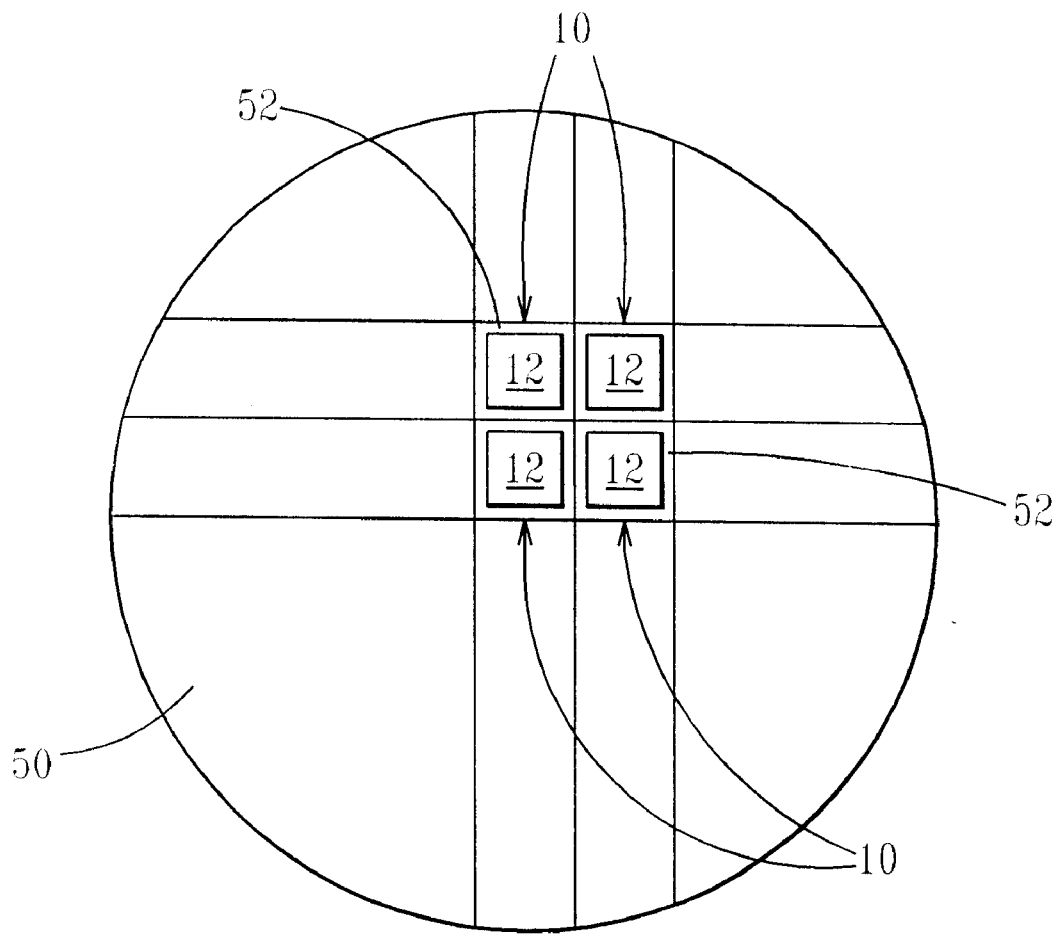

As illustrated in FIGS. 3 and 4 of the drawings, in which the chip carrier substrate 12 is smaller in size than the dimensions of the semiconductor chip 14 on all sides thereof, the assembly process can be implemented on a wafer 50 which is adapted to provide a plurality of individual semiconductor chips 14. Thus, FIGS. 3 and 4 illustrate the plurality or array of chip carriers 12 being assembled onto the wafer 50 prior to the dicing of the wafer into individual semiconductor chips. In essence, the assembly process can be implemented as follows:

a) wafer surface treatment for passivation adhesion to underfill (optional);
 b) solder surface treatment or flux for solder joining;
 c) pick and place chip carriers 12 on the chips 14 at sites which have already been tested for their reliability, with the carrier terminals positioned over the chip solder bumps;
 d) place and process wafer 50 in a solder reflow oven;
 e) implement treatment to enhance underfill (26, 40) adhesion; for example, plasma (optional);
 f) apply underfill materials (26, 40) simultaneously over surface 52 of wafer 50 to ensure filling of underfill 26, 40 into spaces in between the wafer 50 and the chip carriers 12;
 g) implement a thermal cure of the underfill materials 26, 40;
 h) dice the wafer 50 into the individual semiconductor chip packages 10;
 i) test and package in suitable trays for stock; and optionally implement solder ball reflow process for ball grid array.

Figure 5:
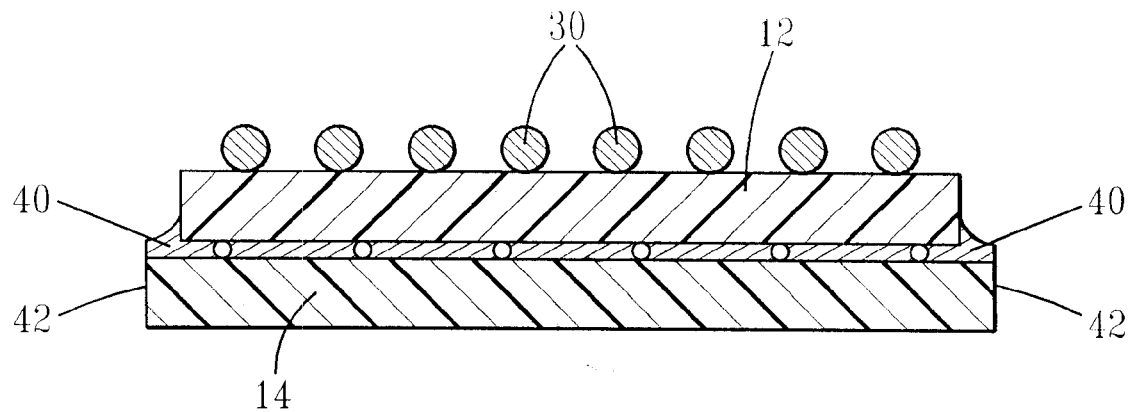
FIG. 5 illustrates a cross-sectional view of a semiconductor chip sliced from the wafer of FIG. 4.

Referring to FIG. 5 of the drawings in which components which are similar to or identical with those of the preceding embodiments are identified by the same reference numerals, this illustrates the assembled module 10 consisting of a single semiconductor chip 14 and the therewith connected chip carrier substrate 12 produced by the wafer dicing procedure.

In the event that the underfill encapsulant is a no-flow underfill encapsulant, the above assembly steps a) to f) may be suitably modified depending upon the materials being employed.

In the event that the assembling process in connection with the foregoing is employed in conjunction with a conductive adhesive, a conductive adhesive film, a conductive paste or other interconnection methods, the above reflow steps may be replaced by appropriate process steps depending upon the materials being employed.

From the foregoing, it becomes readily apparent to one of skill in this art that there is provided a simple electronic or semiconductor package arrangement 10 and a method for producing the latter either individually or sliced from wafers, and wherein this results in the production of small-sized or miniaturized semiconductor chip packages 10 which are lighter in weight and relatively inexpensive to manufacture, and which are more readily adapted for the evermore vigorous standards the applicable electronics technology.

While there has been shown and described what are considered to be preferred embodiments of the invention, it will, of course, be understood that various modifications and changes in form or detail could readily be made without departing from the spirit of the invention. It is, therefore, intended that the invention be not limited to the exact form and detail herein shown and described, nor to anything less than the whole of the invention herein disclosed as hereinafter claimed.

What is claimed is:

1. An electronic package arrangement comprising, in combination:
 (a) a plurality of insulative carrier members;
 (b) a plurality of semiconductor chips being in a wafer form and mounting said plurality of insulative carrier members superimposed one each on respectively of one each said semiconductor chips, said semiconductor chip each being attached to one side of respectively one said insulative carrier member, said semiconductor chip each having at least one edge extending beyond an associated edge of said insulative carrier member; and
 (c) means for effectuating an electrical connection between each said semiconductor chip and said insulative carrier member, said wafer form sliced into a plurality of individual said package arrangements each comprising one said semiconductor chip and insulative chip carrier member.

2. A package arrangement as claimed in claim 1, wherein said electrical connection means comprises electrically conductive bumps being located intermediate each said chip and said carrier member.

3. A package arrangement as claimed in claim 1, wherein said electrical connection means comprises wire bonds extending between each said chip and an opposite side of said carrier member, said wire bonds extending over said associated extending edge of said carrier member.

4. A package arrangement as claimed in claim 1, wherein said electrical connection means comprises electrically conductive bumps located intermediate each said chip and said carrier member; and wire bonds extending between each said chip and an opposite side of said carrier member, said wire bonds extending over said edge of said carrier member.

5. A package arrangement as claimed in claim 1, wherein each said semiconductor chip is dimensioned so as to extend outwardly of the entire periphery of said insulative carrier member.

6. A package arrangement as claimed in claim 1, wherein an opposite side of each said insulative carrier member has solder balls or other electrical interconnection methods thereon for forming electrical connections to another electronic layer.

7. A package arrangement as claimed in claim 1, wherein said electrical connection means each comprise a die bond adhesive interposed between each said chip and said carrier member.

8. A package arrangement as claimed in claim 1, wherein said electrical connection means comprises a conductive adhesive and wire bond, and an underfill consisting of a molding compound encapsulate extending about the edge of the chip surfaces.

9. A method of forming an electronic package arrangement comprising the steps of:
   (a) attaching a plurality of semiconductor chips which are in a wafer form, each respectively to one side of one of a plurality of insulative carrier members which are superimposed one each on respectively one of each said semiconductor chips, said semiconductor chip having at least one edge extending beyond an associated edge of said insulative carrier member; and
   (b) effectuating an electrical connection between each said semiconductor chip and said insulative carrier member, said wafer form is sliced into a plurality of individual said package arrangements each comprising one said semiconductor chip and insulative chip carrier member.

10. A method of forming a package arrangement as claimed in claim 9, wherein each said electrical connection comprises locating electrically conductive bumps intermediate each said chip and said carrier member.

11. A method of forming a package arrangement as claimed in claim 9, wherein said electrical connections each comprises extending wire bonds between said chip and an opposite side of said carrier member, said wire bonds extending over said extending edge of said carrier member.

12. A method of forming a package arrangement as claimed in claim 9, wherein each said electrical connection comprises locating electrically conductive bumps located intermediate each said chip and said carrier member; and extending wire bonds between said chip and an opposite side of said carrier member, said wire bonds extending over said edge of said carrier member.

13. A method of forming a package arrangement as claimed in claim 9, wherein each said semiconductor chip is dimensioned so as to extend outwardly of the entire periphery of said insulative carrier member.

14. A method of forming a package arrangement as claimed in claim 9, wherein an opposite side of each said insulative carrier member has solder balls thereon for forming an electrical connection to another electronic layer.

15. A method of forming a package arrangement as claimed in claim 9, wherein said electrical connection comprises interposing a die bond adhesive interposed between each said chip and said carrier member.

16. A method of forming a package arrangement as claimed in claim 9, wherein said electrical connection comprises providing a conductive adhesive and wire bond, and an underfill consisting of a or molding compound encapsulate extending about the edge of the chip surfaces.

* * * * *